(12) United States Patent
Sato

(10) Patent No.: US 6,907,394 B1
(45) Date of Patent: Jun. 14, 2005

(54) DEVICE FOR SIMULATING CIRCUITS, METHOD FOR SIMULATING THE SAME, AND RECORDING MEDIUM

(75) Inventor: Mitsuru Sato, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 09/570,389

(22) Filed: May 12, 2000

(30) Foreign Application Priority Data

May 17, 1999 (JP) ............................................ 11-136344

(51) Int. Cl.⁷ ........................... G06F 17/50; G06F 9/45; G06G 7/62
(52) U.S. Cl. ............................ 703/19; 703/13; 703/14; 716/4; 716/5
(58) Field of Search .............................. 703/13, 14, 19; 716/4, 5

(56) References Cited

U.S. PATENT DOCUMENTS

| | | | |
|---|---|---|---|
| 5,481,695 A | * | 1/1996 | Purks |
| 5,568,395 A | * | 10/1996 | Huang |
| 5,687,088 A | | 11/1997 | Tomita |
| 5,896,300 A | | 4/1999 | Raghavan et al. |
| 5,901,063 A | | 5/1999 | Chang et al. |
| 5,999,010 A | * | 12/1999 | Arora et al. |
| 6,253,359 B1 | * | 6/2001 | Cano et al. |
| 6,279,142 B1 | * | 8/2001 | Bowen et al. |
| 6,363,516 B1 | * | 3/2002 | Cano et al. |

FOREIGN PATENT DOCUMENTS

| | | |
|---|---|---|
| JP | 04-241068 | 8/1992 |
| JP | 6-120343 | 4/1994 |
| JP | 6-243193 | 9/1994 |
| JP | 7-098727 | 4/1995 |
| JP | 07-182405 | 7/1995 |
| JP | 08-221460 | 8/1996 |
| JP | 10-207937 | 8/1998 |
| JP | 10-275176 | 10/1998 |
| JP | 11-154709 | 6/1999 |

OTHER PUBLICATIONS

Dartu, Florentin et al. "Calculating Worst–Case Gate Delays Due to Dominant Capacitance Coupling". Proc. 34th Annual Desig Automation Conference (DAC). 1997. pp. 46–51. (Henceforth referred to as "Dartu").*
Kyung Tek Lee et al. "Test Generation for Crosstalk Effects in VLSI Circuits". 1996 IEEE Symposium on Circuits and Systems (ISCAS '96), vol. 4, pp. 628–631. May 15, 1996.*
Jiayuan Fang et al. "Shorting Via Arrays for the Elimination of Package Resonance to Reduce Power Supply Noise in Multi–layered Area–Array IC Packages". 1998 IEEE Symposium on IC/Package Design Integration, Feb. 3, 1998.*
Jiayuan Fang et al. "Shorting Via Arrays for the Elimination of Package Resonance to Reduce Power Supply Noise in Multi–layered Area–Array IC Packages". 1998 IEEE Symposium on IC/Package Design Integration, Feb. 3, 1998.*
Chen, Raymond. "SIGRITY Support Page (Tech Paper 2)", Feb. 13, 1998.*

* cited by examiner

Primary Examiner—Kevin J. Teska
Assistant Examiner—Ayal Sharon
(74) Attorney, Agent, or Firm—Foley & Lardner LLP

(57) ABSTRACT

A device for simulating circuits is provided with an identifying system and a verifying system. The identifying system identifies a pair of wires in which two signals operate simultaneously within an appointed period and a pair of wires in which two signals do not operate almost simultaneously within the appointed period. The verifying system verifies actions of a circuit to be analyzed, under an assumption that the coupling capacitor between the pair of wires in which it is judged by the identifying system that two signals do not simultaneously operate within the appointed period is a ground capacitor.

12 Claims, 8 Drawing Sheets

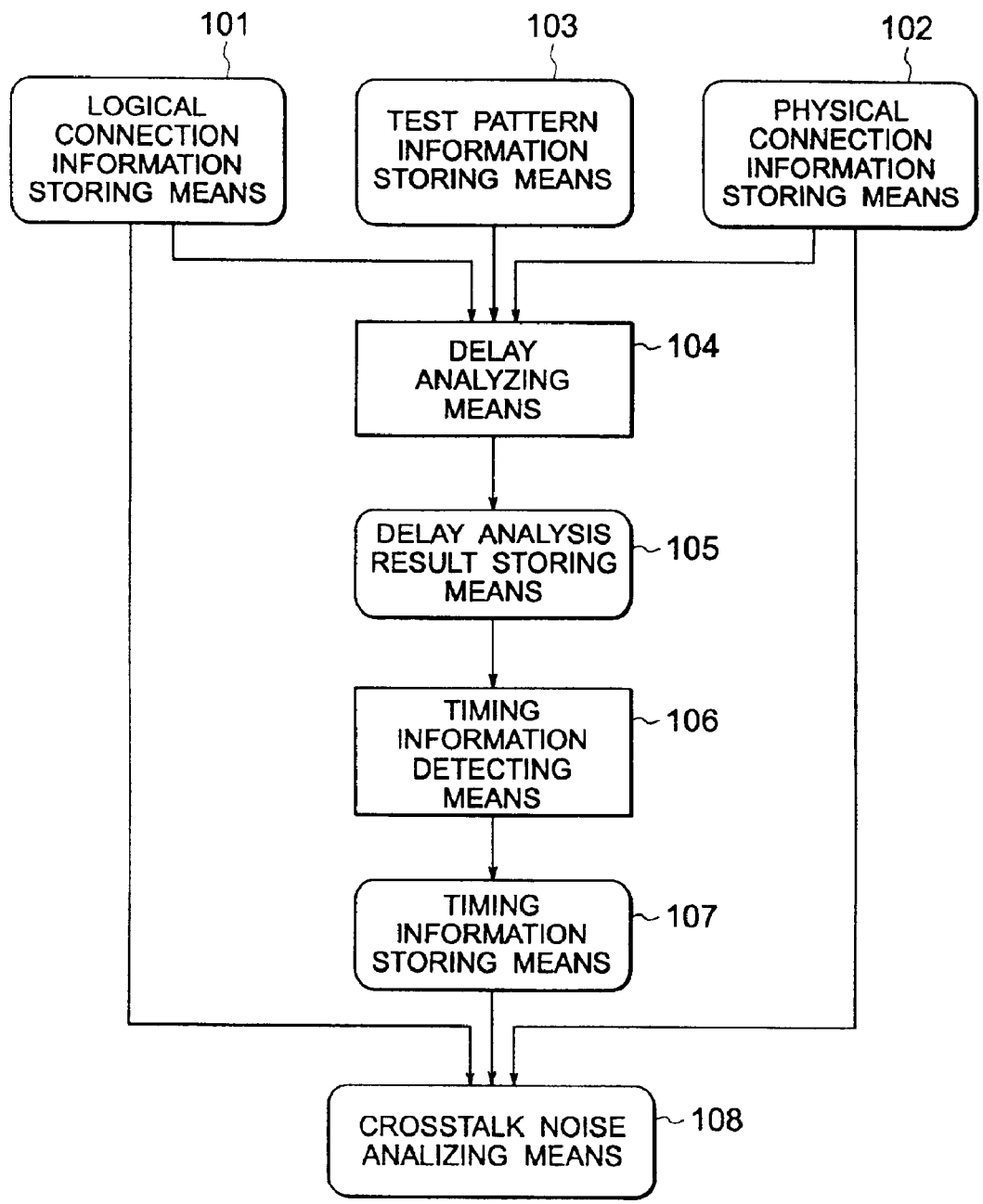

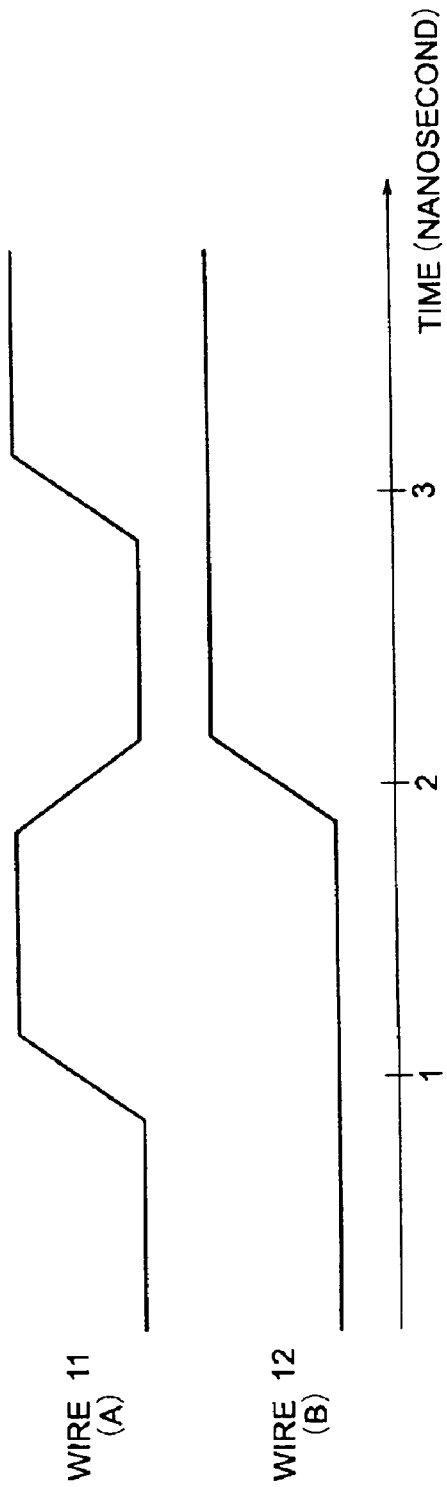

DEVICE FOR SIMULATING CIRCUITS, METHOD FOR SIMULATING THE SAME, AND RECORDING MEDIUM

BACKGROUND OF THE INVENTION

1. Field of the Invention

The present invention relates to a device for simulating circuits, a method for simulating the same, and a computer-readable recording medium in which the circuit simulation program is stored, which are preferable for judging, after a large-scaled integrated circuit (LSI) is designed, whether or not the circuit design is suitable. In particular, the invention relates to a device for simulating circuits, a method for simulating the same, and a computer-readable recording medium in which the circuit simulation programs is stored, which are able to accelerate processes with a constant coupling capacitor regarded as a ground capacitor.

2. Description of the Related Art

In recent years, an interval of wiring has been narrowed in line with further minimization and higher integration of a semiconductor device such as memories, wherein a parasitic capacitor in wiring is increased in line with narrowing of the intervals of wiring. Particularly, as the interval of wiring becomes 0.35 $\mu$m or so, crosstalk noise is increased, influence upon the delay time and consumption of power is gradually increased. FIGS. 1A and 1B exemplarily show influences due to crosstalk noise, wherein FIG. 1A is a timing chart showing signals to be transmitted, and FIG. 1B is a timing chart showing signals which are actually transmitted.

For example, as shown in FIG. 1A, in a case where a signal repeating HIGH and LOW flows in a wire A at an interval of 10 nanoseconds and a signal repeating HIGH and LOW flows in a wire B at an interval of 20 nanoseconds, when both signals rise at the same time, the rise is accelerated, as shown in FIG. 1B. Also, when the signal flowing in the wire A and that flowing in the wire B change in the reverse direction, the rise and fall are decelerated. As a result, the duty ratio is changed, wherein the device may make an erroneous operation.

Therefore, a simulation is carried out at the stage of circuit design of a semiconductor device. A simulation apparatus for a parasitic capacitor between wires is disclosed in, for example, Japanese Laid-Open Patent Application Publication No. 6-243193 (1994). FIG. 2 is a block diagram showing a circuit simulation apparatus disclosed in Japanese Laid-Open Patent Application Publication No. 6-243193.

The prior art circuit simulation apparatus is provided with a logical connection information storing means 101 for storing logical connection information of a circuit to be analyzed, a physical connection information storing means 102 for storing the physical connection information of the circuit to be analyzed, and a test pattern information storing means 103 for storing test patterns used for simulation. It is further provided with a delay analyzing means 104 for analyzing delay of signals in wires on the basis of respective information stored in the logical connection information storing means 101, physical connection information storing means 102, and test pattern information storing means 103. In addition, a delay analysis result storing means 105 is provided, which stores the analysis results by the delay analyzing means 104.

The circuit simulation apparatus is also provided with a timing information detecting means 106 for detecting changes in the timing of signals in wires disposed close to the wire to be analyzed, on the basis of the respective information stored in the delay analysis result storing means 105 and physical connection information storing means 102, and is further provided with a timing information storing means 107 for storing timing information detected by the timing information detecting means 106. And, the apparatus is further provided with a crosstalk noise analyzing means 108 for analyzing how much crosstalk noise is brought into a wire to be analyzed, on the basis of respective information stored in the timing information storing means 107, logical connection information storing means 101, and physical connection information storing means 102.

When carrying out a simulation of crosstalk noise by using the prior art circuit simulation apparatus thus constructed, all the coupling capacitors between wires are taken into consideration as they are, and it is possible to secure high accuracy if the simulation applies to a circuit consisting of 100,000 elements or so.

However, recently, although it becomes possible to list up 10,000,000 elements or so such as resistor elements and capacitor elements in a circuit on the basis of mask data within a practical time, by using a method of layout parasitic extraction (LPE), there is a problem, by which no simulation can be carried out with respect to such a number of elements by the abovementioned circuit simulation apparatus.

An RC degeneration tool, by which the number of resistors and capacitors constituting a circuit can be reduced with no change in the electrical response of the circuit, has been put to practical use, wherein if the capacitor listed up by the LPE is a ground capacitor, which is a capacitor with respect to a ground electrode, it is possible to practically reduce the total numbers of capacitors and resistors to one hundredth or so. However, if the capacitors are coupling capacitors, the total number of capacitors and resistors can be reduced to only one tenth in practical use.

Therefore, 10,000,000 resistor elements and capacitor elements can be reduced to 100,000 elements or so if the capacitor is a ground capacitor. If the capacitors are coupling capacitors, they may be reduced to only 1,000,000 elements or so. In the case of the former, it is possible to carry out a simulation within a practical time period, but in the case of the latter, it takes a remarkably long time to carry out a simulation, and this is not practical.

If a simulation is carried out where it is assumed that the coupling capacitors between all wires are fixed like a coupling capacitor, it is possible to shorten the required time, wherein the accuracy of the simulation may be decreased.

SUMMARY OF THE INVENTION

It is an object of the present invention to provide a device for simulating circuits, a method for simulating the same, and a computer-readable recording medium having a circuit simulation program stored therein, which are able to accelerate processes.

According to one aspect of the present invention, a device for simulating circuits comprises an identifying system and a verifying system. The identifying system identifies a pair of wires in which two signals operate simultaneously within an appointed period and a pair of wires in which two signals do not operate almost simultaneously within the appointed period. The verifying system verifies actions of a circuit to be analyzed, under an assumption that the coupling capacitor between the pair of wires in which it is judged by the identifying system that two signals do not simultaneously operate within the appointed period is a ground capacitor.

In the invention, the process can be accelerated since the verifying system verifies the actions of the circuit under the assumption that a capacitor between wires for which it is judged that two signals do not operate simultaneously within the appointed period. Also, verification is carried out with the capacitor between wires, in which two signals are simultaneously operated within the appointed period, regarded as a coupling capacitor. High accuracy can be brought about.

The identifying system may comprise a preliminary verifying system, a time difference detecting system, and a comparator. The preliminary verifying system preliminarily verifies actions of the circuit, under an assumption that all the coupling capacitors in the circuit are ground capacitors. The time difference detecting system detects a difference between times when potentials of two signals reach an appointed threshold value respectively, in association with results of verification by the preliminary verifying system. The comparator compares the difference between times detected by the time difference detecting system with an appointed value.

The identifying system may comprise a preliminary verifying system, an array generating system, a calculator, and a comparator. The preliminary verifying system preliminarily verifies actions of the circuit, under an assumption that all the coupling capacitors in the circuit are ground capacitors. The array generating system generates an array of a digital signal in relation to whether or not a change in potential exists, with respect to two signals in association with results of verification by the preliminary verifying system. The calculator carries out an appointed calculation on the array generated by the array generating system. The comparator compares a value obtained by the calculator with an appointed value.

According to another aspect of the present invention, a method for simulating circuits comprises a step of identifying a pair of wires in which two signals operate simultaneously within an appointed period and a pair of wires in which two signals do not operate almost simultaneously within the appointed period. The method further comprises a step of verifying actions of a circuit to be analyzed, under an assumption that the coupling capacitor between the pair of wires in which two signals do not simultaneously operate within the appointed period is a ground capacitor.

According to another aspect of the present invention, in a computer-readable recording medium, a circuit simulation program is stored. The circuit simulation program causes a computer to execute a step of identifying a pair of wires in which two signals operate simultaneously within an appointed period and a pair of wires in which two signals do not operate almost simultaneously within the appointed period. The program also causes a computer to execute a step of verifying actions of a circuit to be analyzed, under an assumption that the coupling capacitor between the pair of wires in which two signals do not simultaneously operate within the appointed period is a ground capacitor.

Two signals of a pair of wires being simultaneously operated means a change in the level of signals as both signals change from HIGH to LOW or from LOW to HIGH within an appointed period.

According to the invention, the process can be accelerated since a device for simulating circuit is provided with a verifying system or step which verifies actions of a circuit where a capacitor between wires, for which it is judged that two signals do not simultaneously operate within the appointed period, is regarded as a ground capacitor. Also, since the verification is carried out in a state where a capacitor between wires, in which two signals are simultaneously operated within an appointed period, is handled as a coupling capacitor, high accuracy can be secured. As a result, it is possible to carry out simulations of large-scaled circuits at high accuracy and at a high speed.

BRIEF DESCRIPTION OF THE DRAWINGS

FIGS. 1A and 1B are views exemplarily showing influences crosstalk noise, wherein FIG. 1A is a timing chart showing signals to be transmitted, and FIG. 1B is a timing chart showing signals to be practically transmitted, FIG. 2 is a block diagram showing a prior art circuit simulation device disclosed by Japanese Laid-Open Patent Application Publication No. 6-243193, FIGS. 15A and 15B are views showing a method for judging simultaneous actions according to the second preferred embodiment of the invention, wherein FIG. 15A is a timing chart showing an array of signals in two wires, and FIG. 15B is an exemplary view showing a method for analyzing respective signals.

DESCRIPTION OF THE PREFERRED EMBODIMENTS

In order to solve the abovementioned problems, the present inventor et al. repeated studies and research, and found that a circuit simulation can be carried out with high accuracy by handling the coupling capacitor between wires, in which simultaneous action of signals is carried out, as a coupling capacitor in such a state, and by handling the coupling capacitor between wires, in which no simultaneous action is carried out, as a ground capacitor.

Figures 1A, 1B:
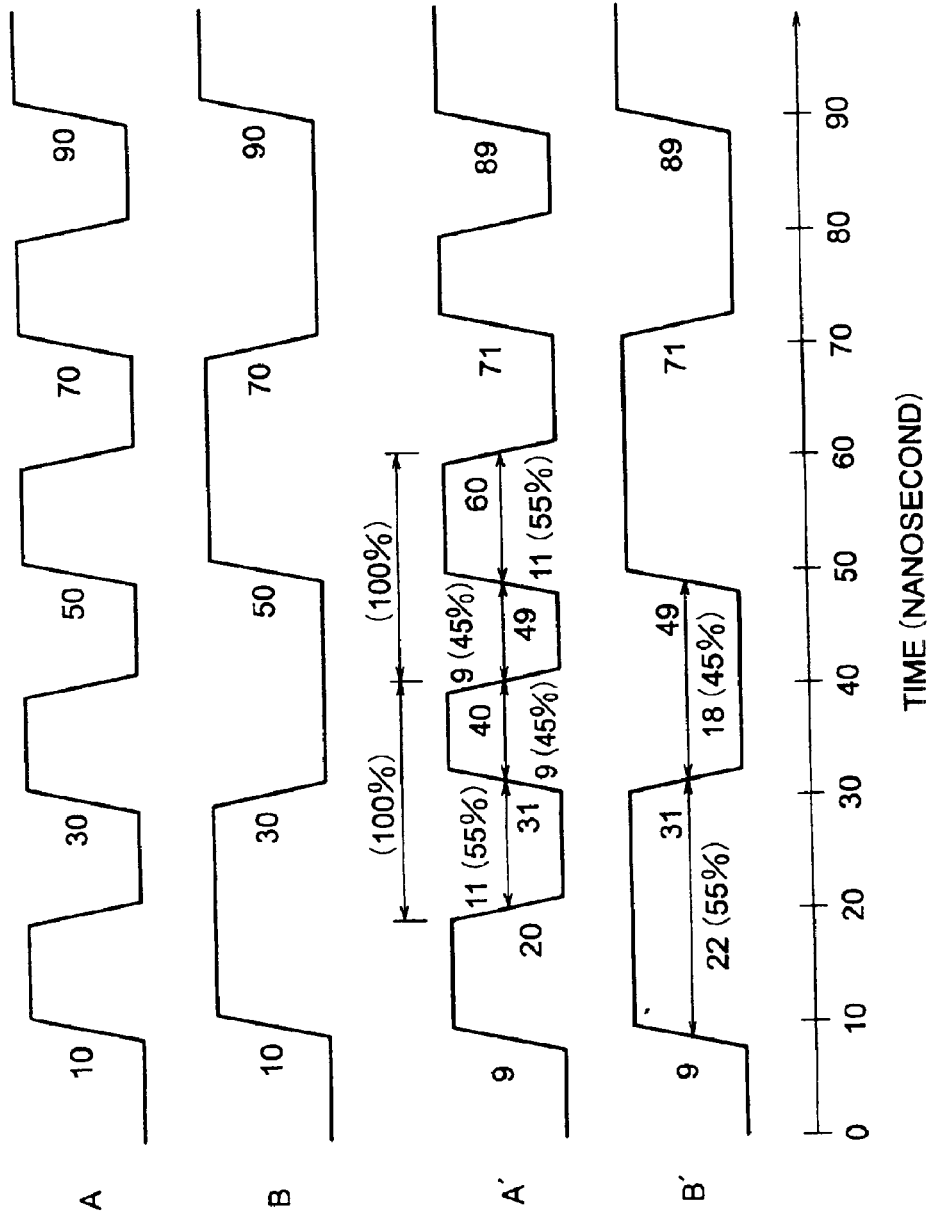
Figure 3A:
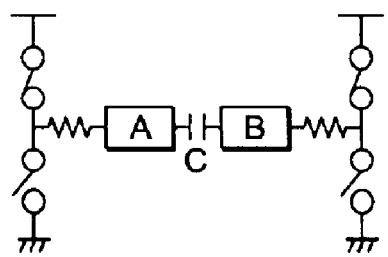
FIG. 3A is a circuit diagram of a coupling model.
Figure 3B:
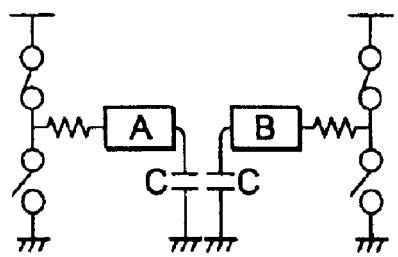
FIG. 3B is a circuit diagram of a ground model.
Figure 4A:
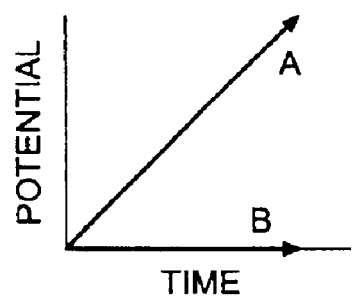
FIGS. 4A through 4D are graphs showing waveforms of various types of input signals.
Figure 4B:
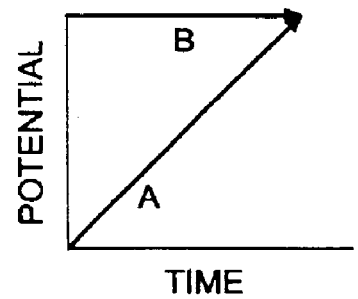
Figure 4C:
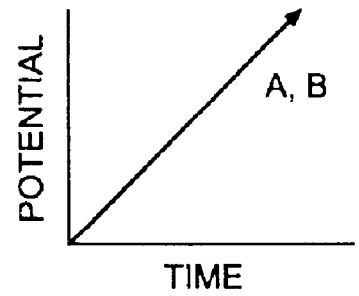
Figure 4D:
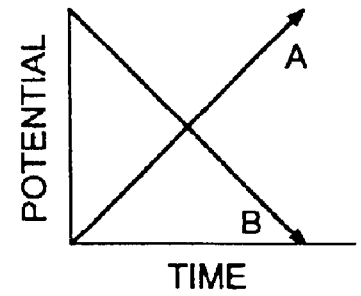
Figure 5A:
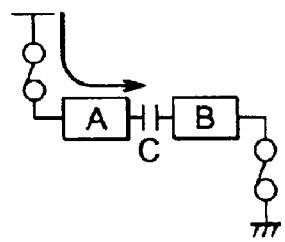
FIGS. 5A and 5B are exemplary views showing flow routes of currents in the coupling model and ground model when signals illustrated in FIG. 4A are inputted.
Figure 5B:
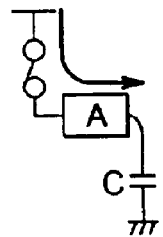
Figure 6A:
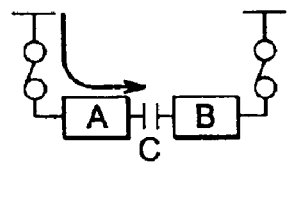
FIGS. 6A and 6B are exemplary views showing flow routes of currents in the coupling model and ground model when signals illustrated in FIG. 4B are inputted.
Figure 6B:
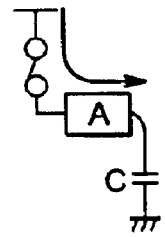
Figure 7A:
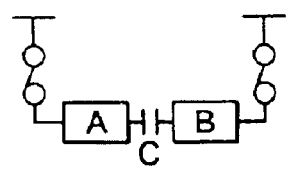
FIGS. 7A and 7B are exemplary views showing flow routes of currents in the coupling model and ground model when signals illustrated in FIG. 4C are inputted.
Figure 7B:
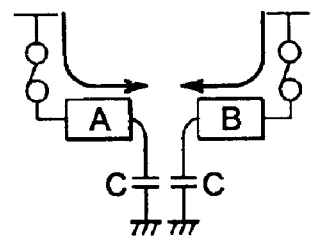
Figure 8A:
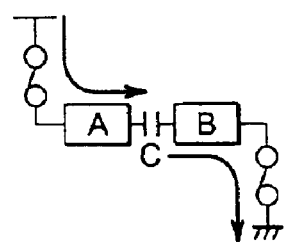
FIGS. 8A and 8B are exemplary views showing flow routes of currents in the coupling model and ground model when signals illustrated in FIG. 4D are inputted.
Figure 8B:
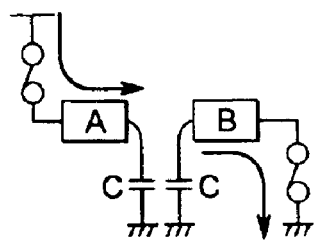

Herein, a description is given of influences upon the consumption of power where the coupling capacitor between wires, in which no simultaneous action is carried out, is handled as a ground capacitor. FIG. 3A is a circuit diagram showing a model (coupling model) where the coupling capacitor between two wires is handled as a coupling capacitor, and FIG. 3B is a circuit diagram showing a model (ground model) where the coupling capacitor between two wires is handled as a ground capacitor. FIG. 4A through 4D are graphs showing waveforms of various types of input signals. Also, FIG. 5A and FIG. 5B are exemplary views showing routes of currents in the coupling model and ground model, respectively, when signals shown in FIG. 4A are inputted. FIG. 6A and FIG. 6B are exemplary views showing routes of currents in the coupling model and ground model, respectively, when signals shown in FIG. 4B are inputted. FIG. 7A and FIG. 7B are exemplary views showing routes of currents in the coupling model and ground model, respectively, when signals shown in FIG. 4C are inputted. FIG. 8A and FIG. 8B are exemplary views showing routes of currents in the coupling model and ground model, respectively, when signals shown in FIG. 4D are inputted.

As shown in FIG. 4A, in the case where the potential in a wire B remains LOW when the potential in a wire A changes from LOW to HIGH, in the coupling model, a current flows as shown in FIG. 5A, and at this time, the consumption of power becomes ($CV^2/2$). On the other hand, in the ground model, a current flows as shown in FIG. 5B. At this time, the consumption of power becomes ($CV^2/2$).

As shown in FIG. 4B, in the case where the potential of the wire B remains HIGH when the potential in the wire A changes from LOW to HIGH, in the coupling model, a current flows as shown in FIG. 6A. At this time, the power consumption becomes ($CV^2/2$). On the other hand, in the ground model, a current flows as shown in FIG. 6B. At this time, the power consumption becomes ($CV^2/2$).

As shown in FIG. 4C, in the case where the potential changes from LOW to HIGH in the wire B when the potential in the wire A changes from LOW to HIGH, in the coupling model, no current flows between the wires as shown in FIG. 7A. Therefore, at this time the power consumption becomes 0. On the other hand, in the ground model, a current flows as shown in FIG. 7B. At this time, the power consumption becomes ($CV^2$).

As shown in FIG. 4D, in the case where the potential in the wire B changes from HIGH to LOW when the potential in the wire A changes from LOW to HIGH, in the coupling model, a current flows as shown in FIG. 8A. At this time, the power consumption becomes ($2CV^2$). Also, in this case, the capacitance of a capacitor seems like (2C) by a mirror effect. On the other hand, in the ground model, a current flows as shown in FIG. 8B, and at this time, the power consumption becomes ($CV^2$).

Thus, as shown in FIG. 4A or 4B, where no simultaneous action is carried out, the power consumption in the coupling model is coincident with that in the ground model. As shown in FIG. 4C or 4D, where a simultaneous action is carried out, the power consumption in the coupling model differs from that in the ground model.

Next, a description is given of influences upon delay of actions where the coupling capacitor between wires in which no simultaneous action is carried out is handled as a ground capacitor. Each of FIG. 9A and FIG. 9B is a graph showing delay of actions when a signal shown in FIG. 4A is inputted, each of FIG. 10A and FIG. 10B is a graph showing delay of actions when a signal shown in FIG. 4B is inputted, each of FIG. 11A and FIG. 11B is a graph showing delay of actions when a signal shown in FIG. 4C is inputted, and each of FIG. 12A and FIG. 12B is a graph showing delay of actions when a signal shown in FIG. 4D is inputted.

Figure 9A:
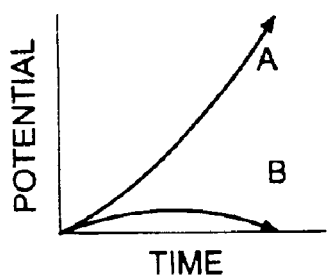
FIGS. 9A and 9B are graphs showing delay of actions when a signal illustrated in FIG. 4A is inputted.
Figure 9B:
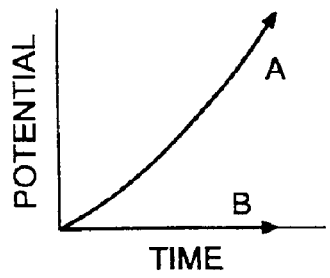

As shown in FIG. 4A, where the potential in the wire B remains LOW when the potential in the wire A changes from LOW to HIGH, in the coupling model, as shown in FIG. 9A, delay occurs in both the wires A and B. In the ground model, as shown in FIG. 9B, delay occurs in only the wire A. Therefore, since these total differences are slight, the influence resulting from handling it as a ground model is very slight.

Figure 10A:
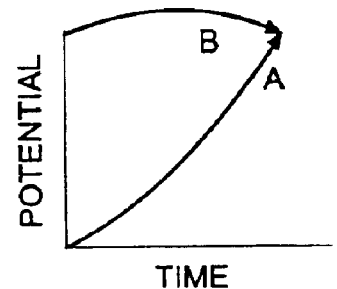
FIGS. 10A and 10B are graphs showing delay of actions when a signal illustrated in FIG. 4B is inputted.
Figure 10B:
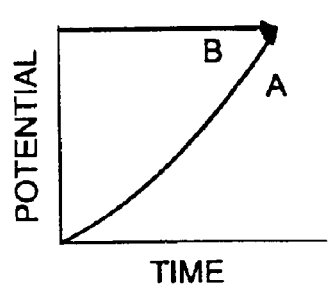

As shown in FIG. 4B, where the potential in the wire B remains HIGH when the potential in the wire A changes from LOW to HIGH, in the coupling model, delay occurs in both the wires A and B as shown in FIG. 10A. In the ground model, delay occurs in only the wire A as show in FIG. 10B. Therefore, since these total differences are slight, the influence resulting from handling it as a ground model is very slight.

Figure 11A:
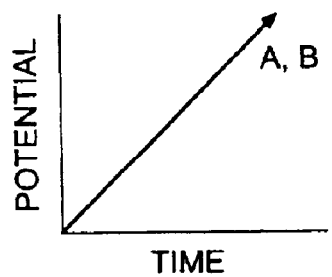
FIG. 11A and 11B are graphs showing delay of actions when a signal illustrated in FIG. 4C is inputted.
Figure 11B:
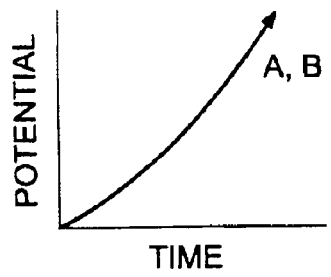
Figure 12A:
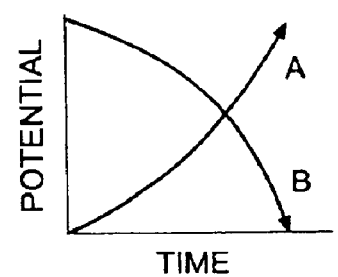
FIGS. 12A and 12B are graphs showing delay of actions when a signal illustrated in FIG. 4D is inputted.
Figure 12B:
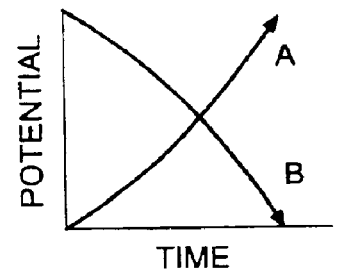

As shown in FIG. 4C, where the potential in the wire B changes from LOW to HIGH when the potential in the wire A changes from LOW to HIGH, in the coupling model, no delay occurs in both the wires A and B as shown in FIG. 11A. However, in the ground model, delay occurs in both the wires A and B as shown in FIG. 11B. Therefore, since these total differences are large, the influence resulting from handling it as a ground model is large.

As shown in FIG. 4D, where the potential in the wire B changes from HIGH to LOW when the potential in the wire A changes from LOW to HIGH, in the coupling model, delay occurs in both the wires A and B as shown in FIG. 12A, and in the ground model, slighter delay than that in the coupling model occurs in both the wires A and B as shown in FIG. 12B. Therefore, since these total differences are large, the influence resulting from handling it as a ground model is large.

Thus, in the case where no simultaneous action is carried out in two wires with respect to power consumption and action delay, the influence is slight even though the coupling capacitor is handled as a ground capacitor, whereby the accuracy of simulation is scarcely lowered.

Figure 13:
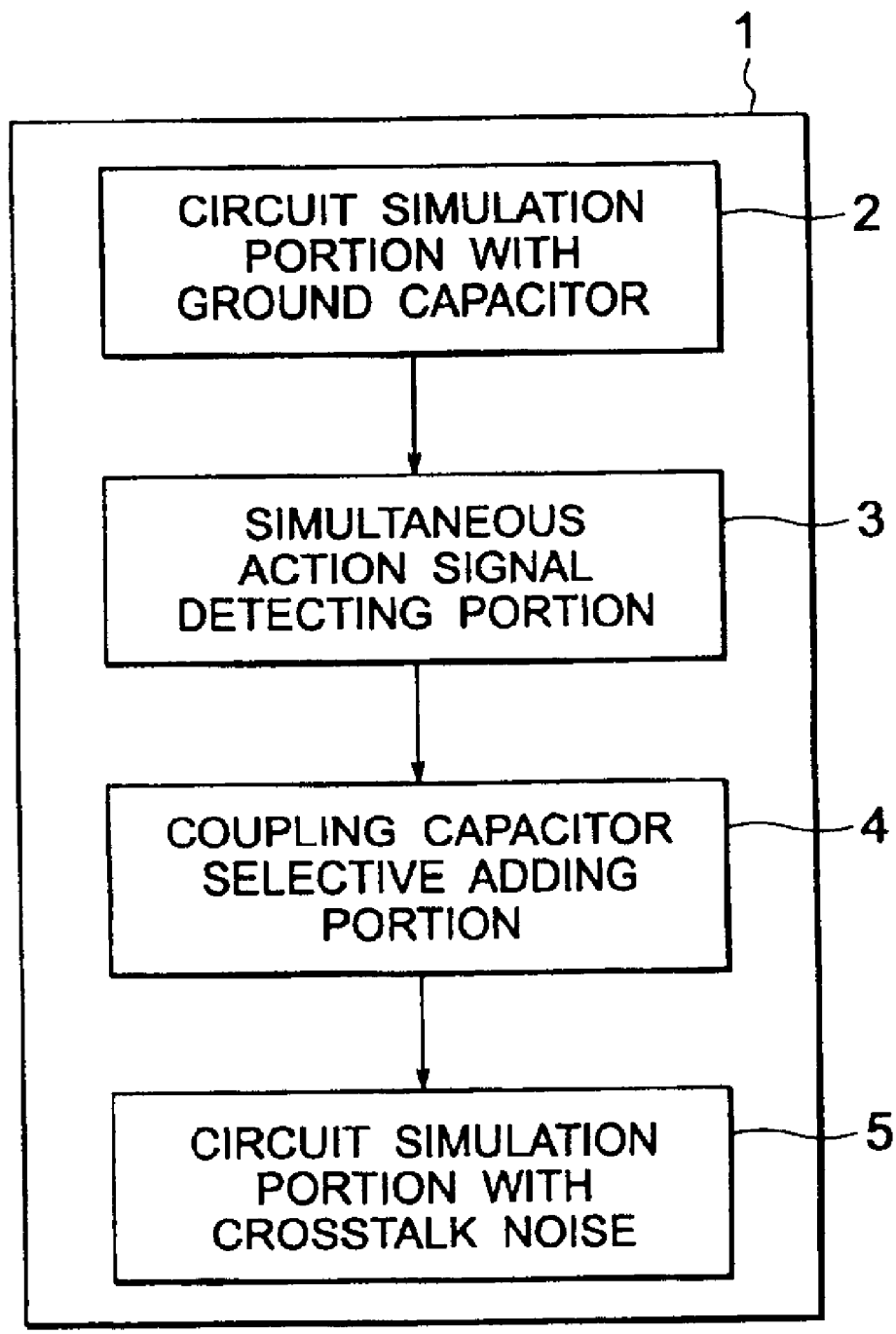
FIG. 13 is a block diagram showing a device for simulating circuits according to the first preferred embodiment of the invention.

Hereinafter, a detailed description is given of a device for simulating circuits according to the preferred embodiments of the invention with reference to the accompanying drawings. FIG. 13 is a block diagram showing a device for simulating circuits according to a first preferred embodiment of the invention.

A device 1 for simulating circuits according to the first preferred embodiment is provided with a circuit simulation portion with a ground capacitor 2. The circuit simulation portion with a ground capacitor 2 carries out simulations of a circuit being an object to be analyzed, where all the coupling capacitors in the circuit being an object for which crosstalk noise is analyzed are handled as ground capacitors. Also, it is further provided with a simultaneous action signal detecting portion 3. The simultaneous action signal detecting portion 3 judges whether or not signal in wires at both ends of respective coupling capacitors, in accordance with an appointed reference on the basis of the results of simulation made by the circuit simulation portion 2 with a ground capacitor.

In addition, the circuit simulation portion 1 is provided with a coupling capacitor selective adding portion 4. By the coupling capacitor selective adding portion 4, the coupling capacitor between wires, in which it is judged that signal are simultaneously operated, is returned from the ground capacitor set by the circuit simulation portion with a ground capacity 2 to a coupling capacitor while the coupling capacitor between wires, in which it is judged by the simultaneous action signal detecting portion 3 that signal are not simultaneously operated, is handled as a ground capacitor. As shown in FIG. 4B, it is established by the coupling capacitor selective adding portion 4 that a ground capacitor equivalent to the coupling capacitor is parasitic in only the wire in which it is judged that signal are not simultaneously operated.

Further, the device 1 for simulating circuits is provided with a circuit simulation portion with crosstalk noise 5. The circuit simulation portion with crosstalk noise 5 carries out simulations of a circuit in which, by the coupling capacitor selective adding portion 4, a coupling capacitor is set in a part thereof and a ground capacitor is set in a part thereof.

Figure 14A:
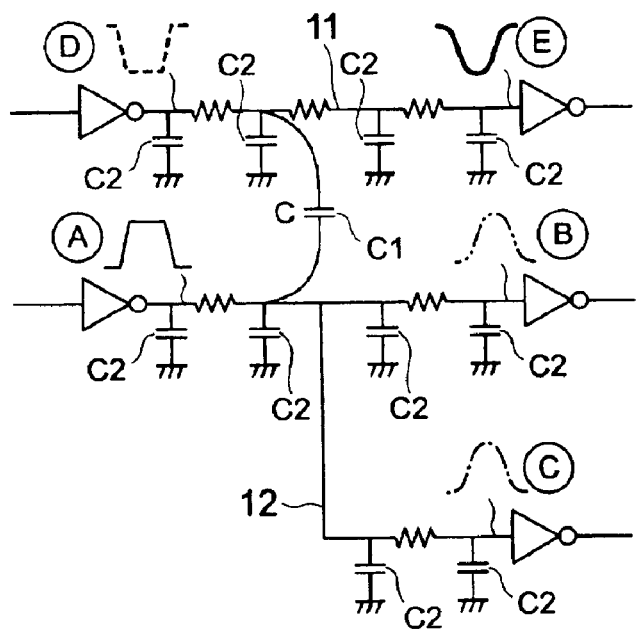
FIG. 14A is an exemplary view showing the actions of a circuit simulation portion with a ground capacitor 2.

Next, a description is given of actions of the device for simulating circuits according to the first preferred embodiment constructed as described above. FIG. 14A is an exemplary view showing actions of the circuit simulation portion with a ground capacitor 2, and FIG. 14B is an exemplary view showing actions of a simultaneous action signal detecting portion 3.

wiring capacity and resistance in a circuit being an object for which crosstalk noise is analyzed, are extracted in advance by a layout parasitic extraction method (LPE), etc. All the coupling capacitors in the circuit whose wiring capacitor and resistance are extracted are handled as ground capacitors by the circuit simulation portion with a ground capacitor 2.

For example, as shown in FIG. 14A, in the case where a coupling capacitor C1 exists between wires 11 and 12, a ground capacitor C2 is set at respective nodes of the wires 11 and 12 instead of the coupling capacitor C1. The capacitance value of the ground capacitor C2 is equivalent to that of the coupling capacitor C1. FIG. 14A shows waveforms of signals at various positions of the wires 11 and 12. The reason why, in FIG. 14A, the waveform at the right side is round while the waveform at the left side is angular, is that delay occurs due to the coupling capacitor C1.

Figure 14B:
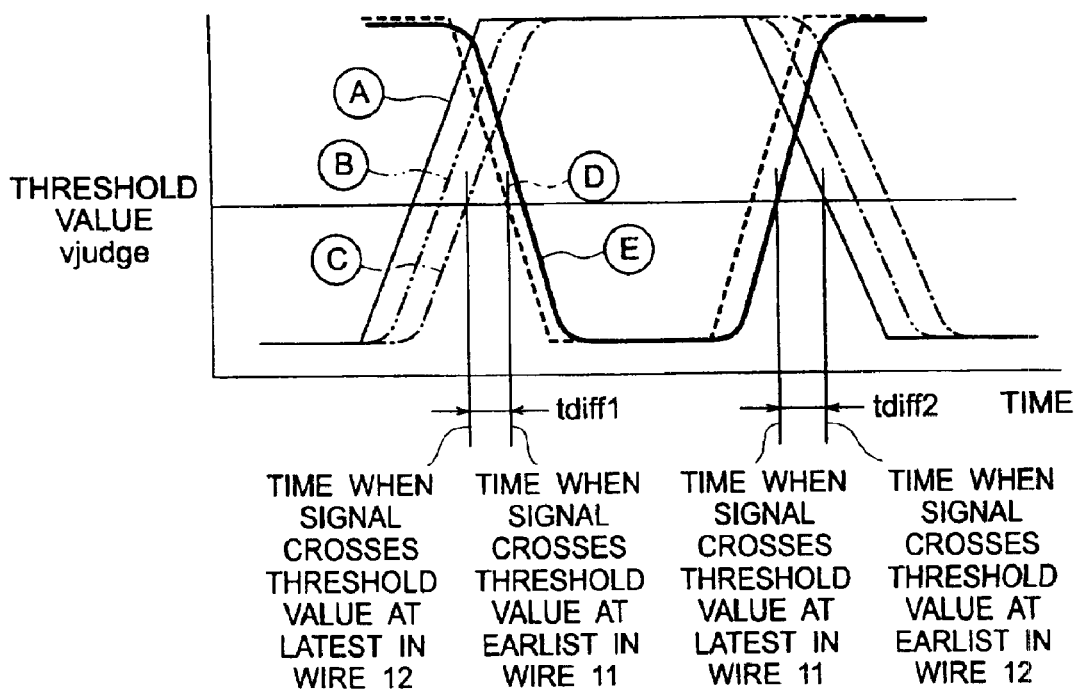
FIG. 14B is an exemplary view showing actions of a simultaneous action signal detecting portion 3.

As the results of the circuit simulation, waveforms of signals as shown in FIG. 14B are obtained. And, the simultaneous action signal detecting portion 3 judges, in accordance with an appointed reference on the basis of such waveforms, whether or not signals at both ends of the respective coupling capacitors simultaneously operate.

Herein, a description is given of the judging method. First, it is assumed that the middle level between HIGH level and LOW level is regarded as a threshold value "vjudge", wherein the time at which signals at the respective positions becomes the threshold value "vjudge" is detected, and an array is prepared, in which the time is handled as an element. Next, after the mutual arrays of coupling capacitors are merged, differences (tdiff1, tdiff2, . . . ) in the times, at which signals becomes the threshold value "vjudge" in the respective actions between the two wires 11 and 12, are measured. On the other hand, a time difference "tjudge", in which actions in the two wires are regarded as simultaneous actions, is set in advance, wherein the minimum value of the difference in the times are compared with the time difference "tjudge". And, if the minimum value is smaller than the latter, it is judged that signals in the two wires are simultaneously operated.

Thereafter, with respect to the coupling capacitor in which signals are judged to be simultaneously operated by the simultaneous action signal detecting portion 3, the coupling capacitor selective adding portion 4 returns it from the ground capacitor to the coupling capacitor. Also, with respect to the coupling capacitor in which no signals are simultaneously operated, the ground capacitor remains unchanged as it is set.

Thereafter, the circuit simulation portion with crosstalk noise 5 carries out simulations of a circuit for which a coupling capacitor is set between wires in which signals simultaneously operate and for which a ground capacitor is Bet between wires in which no signals simultaneously operate.

Generally, the response of the coupling capacitor between signals which do not simultaneously operate is equivalent to the response of the ground capacitor. Also, the simulation speed when being set to the ground capacitor is faster by five times or so than that when being set to the coupling capacitor since the amount of calculation of simultaneous simulation is reduced. Therefore, according to a simulation apparatus according to the embodiment, since the amount of process per unit time can be increased in comparison with the prior arts, it is possible to carry out a great number of simulations while keeping the accuracy very high.

Further, as the results of the circuit simulations described above, it is highly recommended that an alarm device be provided, which issues an alarm with respect wires for which an improvement such as widening of the interval is required due to large crosstalk noise. Based on the alarm, the circuit is re-designed, whereby the circuit simulation and design change are repeated until no alarm is issued, and it is possible to acquire an integrated circuit having high reliability.

Next, a description is given of a second preferred embodiment in which a method for judging simultaneous action of signals in two wires differs from the first embodiment. FIG. 15A and FIG. 15B are views showing a method for judging simultaneous actions in the second preferred embodiment of the invention, wherein FIG. 15A is a timing chart showing an array of signals in the two wires, and FIG. 15B is an exemplary view showing a method for analyzing respective signals.

In the second preferred embodiment, with respect to signals in the two wires shown in FIG. 15A, if the signals changed for, for example, 0.1 nanoseconds, "1" is set. If the signals did not change, "0" is set. And, as shown in FIG. 15B, an array TA(n) is prepared for a wire 11, and an array TB(B) is prepared for a wire 12. Still further, by taking the product of these arrays, another array TAB(n) is prepared.

Thereafter, the sum of the respective factors in the array TAB(n) is found out. Where the sum is "0", it is judged that the signals in the two wires do not simultaneously operate, and as shown in FIG. 15B, if the sum exceeds "0", it is judged that the signals simultaneously operate. All the other actions are the same as those in the first preferred embodiment.

Also in the second preferred embodiment, since simulations are carried out with a ground capacitor set to the two wires in which no signals simultaneously operate. High speed simulations are enabled.

In addition, in the second preferred embodiment, the time for which signals are detected is not specifically limited to 0.1 nanoseconds.

Also, the methods for judging the simultaneous actions of signals are not limited to those in the first and second embodiments.

Further, two wires for which simultaneous actions are judged may be limited to, for example, those whose coupling capacity is 5% or more. That is, judgment may be carried out for only a pair of wires where a capacity exceeding 5% of the capacity of one wire exists in the other wire.

What is claimed is:

1. A device for simulating circuits comprising:
   an identifying system which identifies a pair of wires in which two signals operate simultaneously within an appointed period and a pair of wires in which two signals do not operate simultaneously within said appointed period; and
   a verifying system which verifies actions of a circuit to be analyzed, under an assumption that the coupling capacitor between said pair of wires in which it is judged by said identifying system that two signals do not simultaneously operate within said appointed period is a ground capacitor, said coupling capacitor between said pair of wires being replaced by said ground capacitor.

2. The device for simulating circuits as set forth in claim 1, wherein said identifying system comprises:
   a preliminary verifying system which preliminarily verifies actions of said circuit, under an assumption that all the coupling capacitors in said circuit are ground capacitors;
   a time difference detecting system which detects a difference between times when potentials of two signals reach an appointed threshold value respectively, in association with results of verification by said preliminary verifying system; and
   a comparator which compares said difference between times detected by said time difference detecting system with an appointed value.

3. The device for simulating circuits as set forth in claim 1, wherein said identifying system comprises:
   a preliminary verifying system which preliminarily verifies actions of said circuit, under an assumption that all the coupling capacitors in said circuit are ground capacitors;
   an array generating system which generates an array of a digital signal in relation to whether or not a change in potential exists, with respect to two signals in association with results of verification by said preliminary verifying system;
   a calculator which carries out an appointed calculation on said array generated by said array generating system; and
   a comparator which compares a value obtained by said calculator with an appointed value.

4. A method for simulating circuits comprising the steps of:
   identifying a pair of wires in which two signals operate simultaneously within an appointed period and a pair of wires in which two signals do not operate simultaneously within said appointed period; and
   verifying actions of a circuit to be analyzed, under an assumption that the coupling capacitor between said pair of wires in which two signals do not simultaneously operate within said appointed period is a ground capacitor, said coupling capacitor between said pair of wires being replaced by said ground capacitor.

5. The method for simulating circuits as set forth in claim 4, wherein said identifying a pair of wires comprises the steps of:
   preliminarily verifying actions of said circuit, under an assumption that all the coupling capacitors in said circuit are ground capacitors;
   detecting a difference between times when potentials of two signals reach an appointed threshold value respectively, in association with results of said verification; and
   comparing said difference between times detected with an appointed value.

6. The method for simulating circuits as set forth in claim 4, wherein said identifying a pair of wires comprises the steps of:
   preliminarily verifying actions of said circuit, under an assumption that all the coupling capacitors in said circuit are ground capacitors;
   generating an array of a digital signal in relation to whether or not a change in potential exists, with respect to two signals in association with results of said verification;
   carrying out an appointed calculation on said array; and
   comparing a value obtained by said calculation with an appointed value.

7. A computer-readable recording medium in which a circuit simulation program is stored, said circuit simulation program causing a computer to execute the step of:
   identifying a pair of wires in which two signals
   operate simultaneously within an appointed period and a pair of wires in which two signals do not operate simultaneously within said appointed period; and
   verifying actions of a circuit to be analyzed, under an assumption that the coupling capacitor between said pair of wires in which two signals do not simultaneously operate within said appointed period is a ground capacitor, said coupling capacitor between said pair of wires being replaced by said ground capacitor.

8. The computer-readable recording medium as set forth in claim 7, wherein said identifying a pair of wires comprises the steps of:
   preliminarily verifying actions of said circuit, under an assumption that all the coupling capacitors in said circuit are ground capacitors;
   detecting a difference between times when potentials of two signals reach an appointed threshold value respectively, in association with results of said verification; and
   comparing said difference between times detected with an appointed value.

9. The computer-readable recording medium as set forth in claim 7, wherein said identifying a pair of wires comprises the steps of:
   preliminarily verifying actions of said circuit, under an assumption that all the coupling capacitors in said circuit are ground capacitors;
   generating an array of a digital signal in relation to whether or not a change in potential exists, with respect to two signals in association with results of said verification;
   carrying out an appointed calculation on said array; and
   comparing a value obtained by said calculation with an appointed value.

10. The device as recited in claim 1 wherein the capacitance value of said coupling capacitor between said pair of wires is equal to that of said ground capacitor.

11. The method as recited in claim 4, wherein the capacitance value of said coupling capacitor between said pair of wires is equal to that of said ground capacitor.

12. The computer-readable recording medium as recited in claim 7 wherein the capacitance value of said coupling capacitor between said pair of wires is equal to that of said ground capacitor.

* * * * *